(12) United States Patent
Perry et al.

(10) Patent No.: US 6,678,847 B1
(45) Date of Patent: Jan. 13, 2004

(54) REAL TIME FUNCTION VIEW SYSTEM AND METHOD

(75) Inventors: Patrick E. Perry, Shelburne, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/303,211

(22) Filed: Apr. 30, 1999

(51) Int. Cl.$^7$ ............................................. G01R 31/28
(52) U.S. Cl. ..................... 714/727; 714/729; 714/731
(58) Field of Search .......................... 714/30, 726, 727, 714/729, 731

(56) References Cited

U.S. PATENT DOCUMENTS

| | | | | |
|---|---|---|---|---|
| 4,932,028 A | * | 6/1990 | Katircioglu et al. | 714/45 |
| 4,954,988 A | * | 9/1990 | Robb | 365/189.02 |
| 5,229,999 A | * | 7/1993 | Cushing et al. | 714/703 |
| 5,257,223 A | * | 10/1993 | Dervisoglu | 365/154 |
| 5,383,143 A | * | 1/1995 | Crouch et al. | 708/254 |
| 5,448,430 A | * | 9/1995 | Bailey et al. | 360/77.12 |
| 5,477,545 A | * | 12/1995 | Huang | 714/727 |
| 5,488,688 A | | 1/1996 | Gonzales et al. | 395/183.1 |
| 5,490,151 A | * | 2/1996 | Feger et al. | 714/727 |
| 5,491,793 A | | 2/1996 | Somasundaram et al. | 395/183.21 |
| 5,530,706 A | * | 6/1996 | Josephson et al. | 714/727 |
| 5,546,406 A | * | 8/1996 | Gillenwater et al. | 714/733 |
| 5,590,354 A | | 12/1996 | Klapproth et al. | 395/800 |
| 5,596,584 A | * | 1/1997 | Warren | 714/726 |
| 5,598,421 A | | 1/1997 | Tran et al. | 371/22.3 |
| 5,623,502 A | | 4/1997 | Wang | 371/22.3 |
| 5,640,404 A | * | 6/1997 | Satish | 714/727 |
| 5,717,701 A | * | 2/1998 | Angelotti et al. | 714/30 |
| 5,724,505 A | | 3/1998 | Argade et al. | 395/183.21 |
| 5,768,289 A | * | 6/1998 | James | 714/727 |
| 5,859,657 A | * | 1/1999 | Donahue et al. | 347/237 |
| 5,900,753 A | * | 5/1999 | Cote et al. | 327/145 |
| 5,986,962 A | * | 11/1999 | Bertin et al. | 365/228 |
| 6,000,051 A | * | 12/1999 | Nadeau-Dostie et al. | 714/727 |
| 6,012,155 A | * | 1/2000 | Beausang et al. | 714/727 |
| 6,052,808 A | * | 4/2000 | Wu et al. | 714/727 |
| 6,055,649 A | * | 4/2000 | Deao et al. | 714/30 |
| 6,122,762 A | * | 9/2000 | Kim | 714/726 |
| 6,134,517 A | * | 10/2000 | Baxter et al. | 703/28 |
| 6,182,256 B1 | * | 1/2001 | Qureshi | 714/726 |
| 6,185,710 B1 | * | 2/2001 | Barnhart | 714/727 |
| 6,304,099 B1 | * | 10/2001 | Tang et al. | 326/38 |
| 6,442,178 B1 | * | 8/2002 | Arato et al. | 370/506 |

OTHER PUBLICATIONS

IEEE Standard Test Access Port and Boundary–Scan Architecture, IEEE Std 1149.1–1990.*
IBM Technical Disclosure Bulletin, "Efficient Mechanism for Multiple Debug Modes." vol. 38, No. 11, Nov. 1995.

* cited by examiner

Primary Examiner—Albert Decady
Assistant Examiner—Joseph D. Torres
(74) Attorney, Agent, or Firm—Downs Rachlin Martin PLLC

(57) ABSTRACT

A system and method for determining the operational state of a logic device having a plurality of shadow registers, each associated with one of a plurality of functional registers. Data stored in a functional register is, under selected conditions, also stored in an associated shadow register. These conditions include without limitation receipt by the functional register of predetermined event information such as an opcode, memory address or other information. Data in a given set of functional registers, e.g., registers making up pipeline stages in a microprocessor, may be stored in shadow registers simultaneously or sequentially when given data reaches a given register in the set. Additionally, data is stored in the shadow registers without interrupting execution cycles of the logic device.

6 Claims, 5 Drawing Sheets

REAL TIME FUNCTION VIEW SYSTEM AND METHOD

FIELD OF THE INVENTION

The present invention pertains to semiconductor logic devices and, more particularly, to a system for storing and retrieving the contents of functional registers in semiconductor logic devices at selected stages of operation without interrupting logic execution.

BACKGROUND OF THE INVENTION

In connection with the design and development of microprocessors and other semiconductor logic devices it is necessary to debug functional problems that arise during testing of the devices. This testing is a large component of the overall development time for a new logic device, and consumes significant computing and human resources. Current product design cycles and development costs do not permit complete regression analysis at design time due to the large number of possible opcode/function combinations, limited bandwidth of the test case generation and computing and human resource constraints.

As such, testing of logic devices must be performed in a carefully targeted manner using, for example, trace buffers or JTAG (joint test action code) support functionality. To test a logic device using JTAG support, hooks are provided in the logic design that breakpoint or halt an operating function when a breakpoint instruction is received. After breakpointing the operation the JTAG support function reads out data from the requested registers through a JTAG port. Then the application is restarted and runs until the next breakpoint is encountered. Unfortunately, the freezing of a function can break the application undergoing debug. In timing critical or real-time code, e.g., code for controlling a disk drive, such breakage of the application can render the JTAG support function inoperable.

For these and other reasons current techniques for testing and debugging logic devices, particularly pipelined microprocessor designs, are not entirely satisfactory.

SUMMARY OF THE INVENTION

One aspect of the present invention is a logic device having a functional execution period with a plurality of execution cycles. The device comprises a plurality of functional registers, each for storing data during an execution cycle and a plurality of shadow registers, each associated with one of the plurality of functional registers and capable of storing a copy of data provided to the associated one of the plurality of functional registers during the functional execution period without interrupting the execution cycles. The device further includes control logic connected to the plurality of shadow registers for controlling when data provided to the plurality of functional registers is stored in the plurality of shadow registers and for retrieving data from the plurality of shadow registers without interrupting the plurality of execution cycles.

Another aspect of the present invention is a logic register combination for use in a logic device having a functional execution period with a plurality of execution cycles. The combination comprises a plurality of functional registers, each for storing data during an execution cycle and a plurality of shadow registers, each associated with one of the plurality of functional registers and capable of storing a copy of data provided to the associated one of the plurality of functional registers during the functional execution period without interrupting the execution cycles.

Still another aspect of the present invention is a method of determining the operational state of a logic device having a plurality of first registers in which data is stored and a plurality of second registers, each second register associated with at least one of said first registers, further wherein the logic device has an execution period with a plurality of execution cycles. The method comprises the step of storing data present in each of the plurality of first registers in an associated one of the plurality of second registers without interrupting execution cycles of the plurality of first registers. Next, data stored in the plurality of second registers is retrieved without interrupting execution cycles of the plurality of first registers. Finally, the data retrieved in the previous step is used to determine the operational state of the logic device.

Yet another aspect of the present invention is a method of debugging a microprocessor having a plurality of L1 registers, a plurality of L2 registers and a plurality of shadow registers, all arranged so that one of the plurality of L1 registers and one of the plurality of L2 registers is associated with each of the plurality of shadow registers, with the plurality of L1 registers, the plurality of L2 registers and plurality of shadow registers being arranged in a pipelined architecture. As the first step of the method, data is provided to the plurality of shadow registers. Next, the data in each of the plurality of shadow registers is provided to a corresponding respective one of the plurality of L2 registers as a function of event type, execution cycle and shadow register address. Finally, a logic operation is performed on the data provided to the L2 registers.

BRIEF DESCRIPTION OF THE DRAWINGS

FIG. 5a is schematic diagram of the shadow register controller of FIG. 3;

FIG. 5b is an alternative embodiment of the shadow register controller of FIG. 5a;

DETAILED DESCRIPTION OF THE INVENTION

Figure 1:
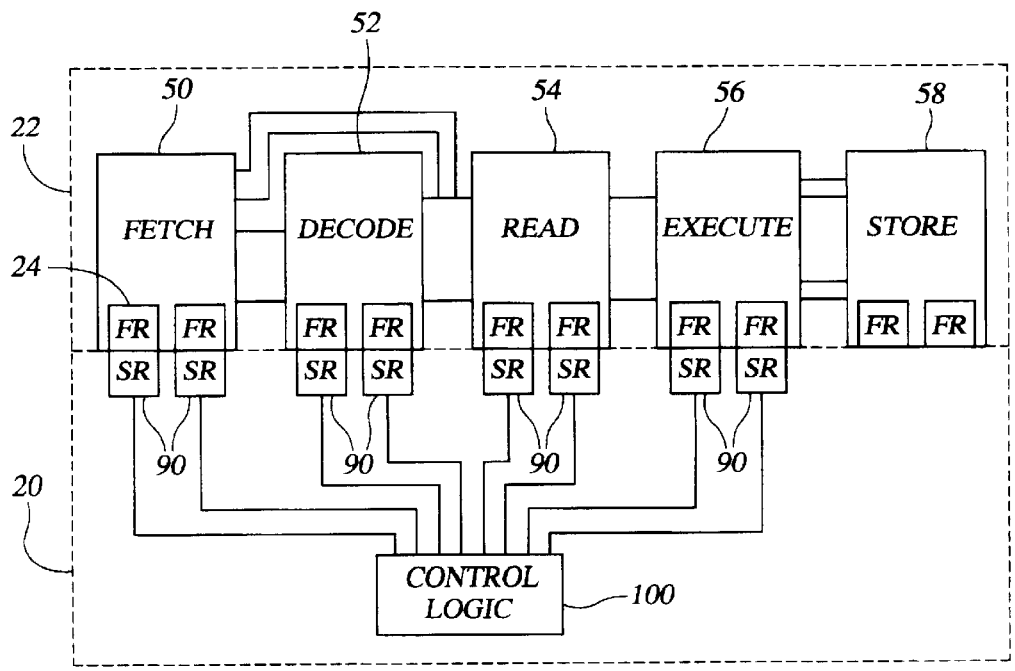
FIG. 1 is a schematic diagram of the present invention implemented with respect to a pipelined microprocessor architecture.
Figure 2:
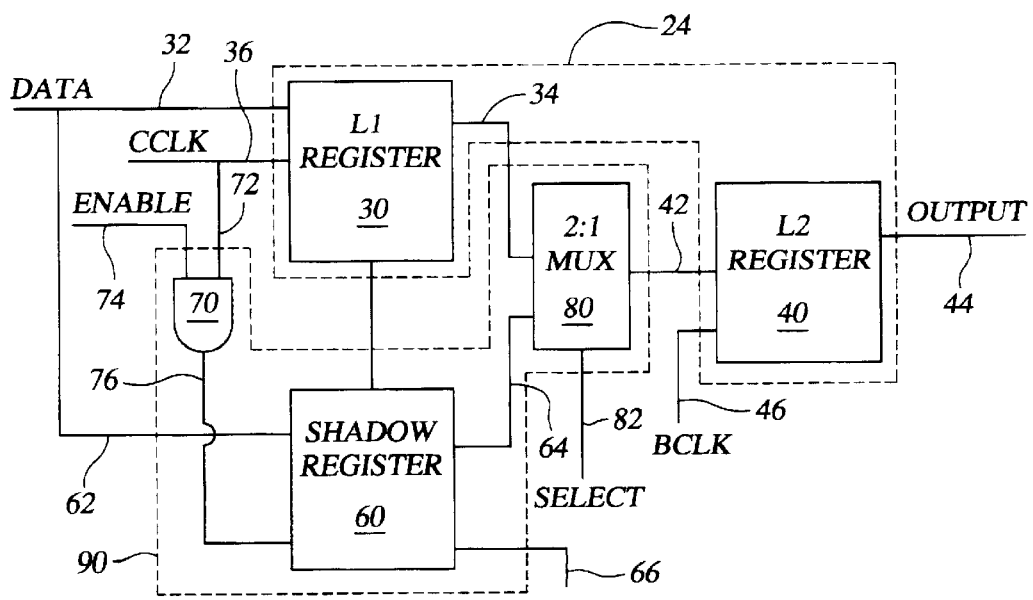
FIG. 2 is a circuit diagram of the one of the plurality of shadow register circuits used in the present invention and a functional register circuit with which the shadow register circuit is used

Referring to FIGS. 1 and 2, the present invention is a shadow register system 20 designed for use with a conventional logic device 22, such as a microprocessor or ASIC. Logic device 22 includes a plurality of functional registers 24 for storing data such as opcodes, memory addresses, memory contents and other information. As described in more detail below, shadow register system 20 permits the contents of functional registers 24 to be viewed without interrupting execution cycles of logic device 22.

Each functional register 24 includes an L1 register 30 having an associated data-in line 32 and data-out line 34. A cclk line 36 is connected to L1 register 30 for providing clock signals used to control the L1 register. Functional register 24 also preferably includes an L2 register 40 having an associated data-in line 42 and data-out line 44. A bclk line 46 is connected to L2 register 40 for providing clock signals used to control the L2 register. Data provided from L1 register 30 on data-out line 34 is provided to L2 register 40 via data-in line 42. Data is output from L2 register 40 via data-out line 44 to downstream registers or other circuit elements. Thus, L1 register 30 functions as a capture latch and L2 register 40 functions as a launch latch. Alternatively, functional register 24 may include only L1 register 30 and not L2 register 40.

Shadow register system 20 may also be used with functional registers 24 having other designs.

For purposes of discussing the context in which the shadow register system 20 may be used, and not as a limitation of the present invention, logic device 22 may be implemented as a pipelined microprocessor having a plurality of stages, each including a plurality of functional registers 24, only two of which are shown in each stage to simplify illustration. These stages may include a fetch stage 50 for fetching an opcode, a decode stage 52 for decoding the opcode, a read stage 54 for reading the contents at a given memory address, an execute stage 56 for executing the opcode with respect to the memory contents, and a store stage 58 for storing the result of such execution. Known control logic (not shown) not forming part of the present invention is connected to stages 50–58 for controlling the operating of functional registers 24 and other elements included in such control logic.

Shadow register system 20 includes a plurality of shadow registers 60, each associated with a corresponding respective L1 register 30. While each shadow register 60 is associated with a L1 register 30, each L1 register is not necessarily associated with a shadow register 60. Shadow register 60 has a conventional logic register design, may be identical in design to L1 register 30, or may have a different design. Each shadow register 60 has a data-in line 62, a first data-out line 64 and a second data-out line 66. Data-in line 62 is connected to data-in line 32 so that all data provided to L1 register 30 is also available to shadow register 60.

Associated with each shadow register 60 is an AND gate 70. The latter is connected via line 72 to cclk line 36 so that the clock signal on the cclk line is an input to the AND gate. An enable line 74 is connected to AND gate 70 as a second input. The output of AND gate 70 is provided via line 76 as an input, i.e., the clock input, to shadow register 60. As described in more detail, when an enable command is provided on enable line 74 and a clock signal is received on cclk line 36, AND gate 70 provides an output causing shadow register 60 to receive data present on data-in line 32 at the same time such data is provided to L1 register 30.

A 2:1 multiplexer 80 is preferably, but not necessarily, associated with each shadow register 60. Data-out line 34 and data-out line 64 are connected as inputs to multiplexer 80, with the output of the multiplexer being provided as an input to L2 register via data-in line 42. Multiplexer 80 is connected to select line 82 which provides a select control that determines whether the output of the multiplexer is the data available on data-out line 34 or data-out line 64. If the functionality provided by multiplexer 80, discussed below, is not required, data-out line 34 of L1 register 30 may be connected directly to data-in line 42 of L2 register 40. In this case, only the data captured by L1 register 30 is provided to L2 register 30. Other logic elements having similar functionality may be used in place of multiplexer 80.

Together, shadow register 60, AND gate 70 and, if provided, multiplexer 80, make up shadow register circuit 90. Connected to each shadow register circuit 90 is control logic 100 which controls the operation of the elements of circuit 90, as described in more detail below.

Referring to FIGS. 1–5a control logic 100 includes event detector 110, shadow register controller 112, retrieval controller 114, a scan controller 116, a N:1 multiplexer 120, and a shift register 122. As described in more detail below, event detector 110 generates a trigger signal upon occurrence of a specified event, e.g., receipt of a selected opcode, which is used by shadow register controller 112 to generate the lock signal provided via line 74 to AND gate 70. Retrieval controller 114 controls the operation of N:1 multiplexer 120. Scan controller 116 scans data into event detector 110 and shadow register controller 112, and controls the operation of retrieval controller 114. Scan controller 116 may be a conventional JTAG or other scan controller of the type used in connection with logic design and debug.

Figure 4:
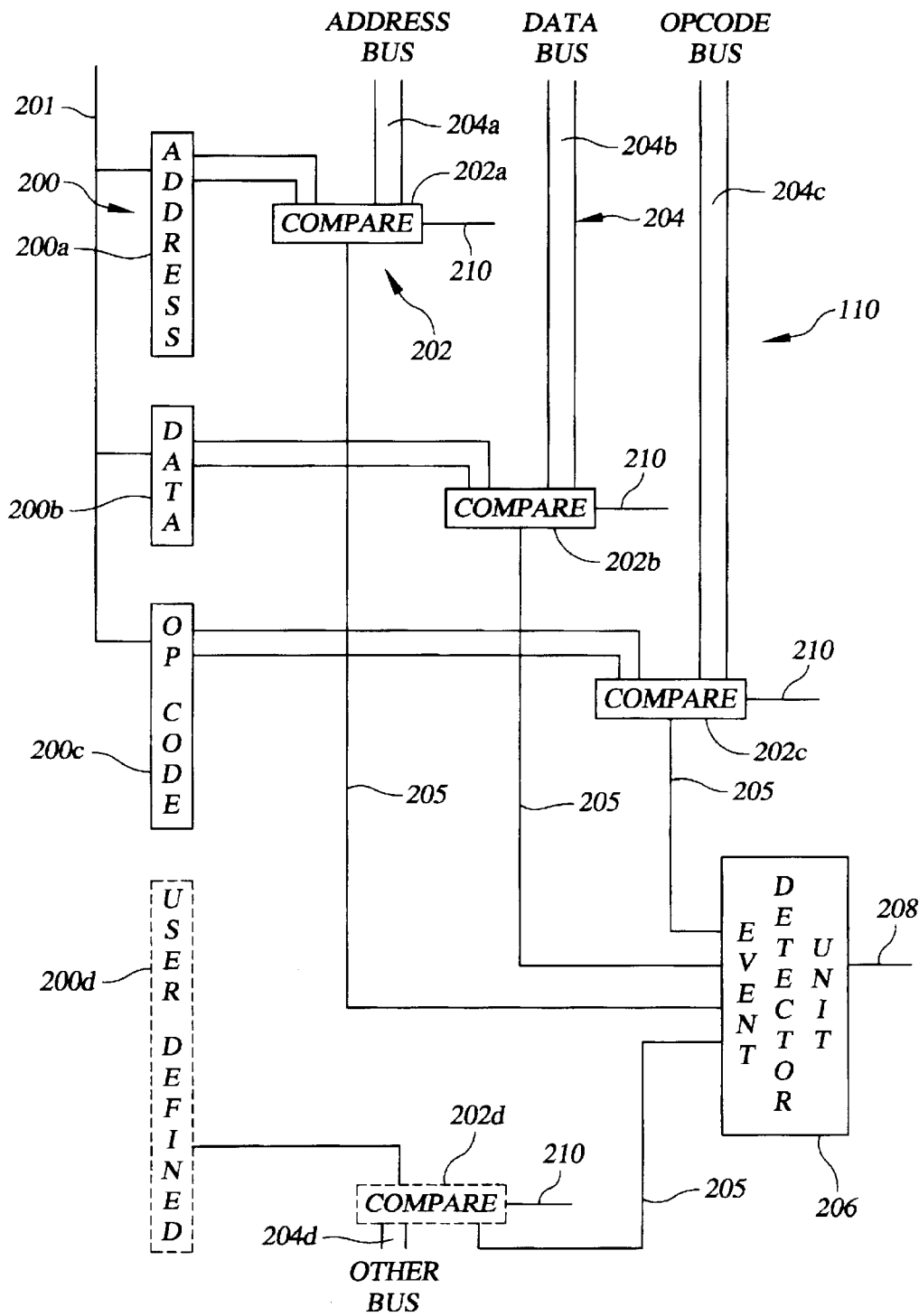
FIG. 4 is a schematic diagram of the event detector in the control logic of FIG. 3.

With reference to FIG. 4, event detector 110 includes a plurality of registers 200 for storing information that is used to trigger generation of the lock signal, e.g., an address register 200a for storing memory addresses, a data register 200b for storing memory contents available at a memory address, an opcode register 200c for storing an opcode and a user-defined register 200d for storing other user-defined information. At least one register 200 is provided for each event type, e.g., memory address and opcode. Broadly speaking, and as used in the claims, "data" includes all types of information that may be stored in registers 200, not, for example, just memory contents available at a memory address. The type and number of registers 200 illustrated in FIG. 4 is exemplary and not limiting. In practice, tens, hundreds or thousands of registers 200 may be used in event detector 110. The contents of registers 200 are provided by scan controller 116 via line 201, with which each register is connected.

Event detector 110 also includes a plurality of compare circuits 202, each connected to a corresponding respective register 200. For example, compare circuit 202a is connected to register 200a, compare circuit 202b is connected to register 200b, and so on. Compare circuits 202 are made up of conventional logic elements that together provide an output when two identical inputs are received. Compare circuits 202 are connected to buses 204 that are connected to sources of information with which the contents of registers 200 are compared. For example, compare circuit 202a is connected to address bus 204a on which memory addresses are provided, compare circuit 202b is connected to address bus 204b on which memory contents available at a memory address are provided, compare circuit 202c is connected to address bus 204c on which opcodes are provided and compare circuit 202d is connected to address bus 204d on which other information is provided. When the information provided on a bus 204 connected to a compare circuit 202 is identical to the information stored in a register 200 connected to the compare circuit, the latter provides a trigger signal.

The output of each compare circuit 202 is provided via line 205 as an input to event detector unit 206. The latter may be implemented, for example, as an OR gate. Following receipt of an output from compare circuit 202, event detector unit 206 generates a trigger signal that is provided on output line 208 to shadow register controller 112. Each compare circuit 202 also includes an output line 210 used to provide the MSBs of a RAM address, as discussed in more detail below.

While not illustrated, the present invention encompasses the use of additional compare circuits downstream of, and connected with, compare circuits 202. These additional compare circuits are interconnected with various logic elements, e.g., AND gates, so as to cause generation of an output to event detector unit 206 upon the arrival of multiple triggering information. Such information may include, for example, the arrival of selected data on data bus 204b and the arrival of a selected opcode on opcode bus 204c.

Turning now to FIG. 5a, shadow register controller 112 includes an address generator 228 having a counter 230, and register 236. Counter 230 is a conventional logic counter of appropriate size for the intended application, e.g., an 8-bit counter, and is used to count execution cycles of logic device 22, as described below, based on clock signals received on clock line 233. Counter 230 generates a bit string that is provided via lines 234 to RAM 232, with bits in the string representing the LSB's of the RAM address. Address generator 228 includes a plurality of registers 236, each connected to output line 210 of compare circuits 202, whereby the output of a compare circuit 202 may be provided to a register 236. Each register 236 is connected to RAM 232 via a line 238. Address generator 228 is also connected to scan controller 116 via line 240.

RAM 232 is organized into a plurality of memory blocks 250, one for each event type, and event type combinations. For example, if event detector 110 is capable of detecting four event types, i.e., one for each register 200 in event detector 110, then 16 memory blocks 250 are provided. Each memory block 250 includes m words of data, each word of data is n bits wide. The number of words m in each block is determined by the size of the counter, and is equal to 2 raised to the number of bits in the counter.

Each one of the n bits in RAM 232 is associated with one or more shadow registers 60, the state of such bit (0 or 1) determines whether RAM 232 provides a lock signal to the one or more shadow registers) 60. The output of RAM 232 consists of enable signals, typically provided in the form of lock bits, that are provided via enable lines 74 to the AND gates 70 associated with the shadow register circuit 90. Each of the n outputs of the RAM 232 provide the lock signal to associated one or more shadow registers 60.

As described in more detail below, the memory organization of RAM 232 permits data to be stored in shadow registers 60 with complete programmability as a function of various combinations of event type, execution cycle and shadow register addresses (i.e., shadow registers selected).

Figure 3:
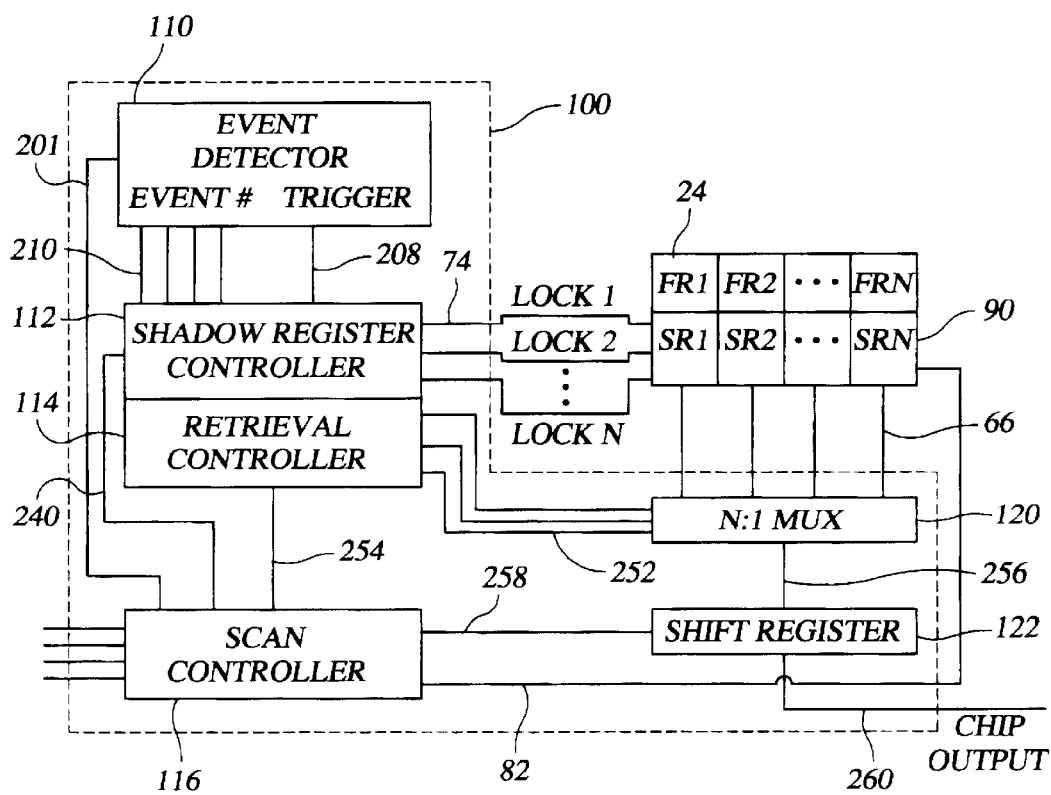
FIG. 3 is schematic diagram of the control logic used to control the operation of the circuit of FIG. 2.

Referring to FIG. 3, retrieval controller 114 is connected to N:1 multiplexer 120 via lines 252 and to scan controller via line 254. Retrieval controller 114 provides address bits via lines 252 that identify selected shadow registers 60 from which data is to be scanned out. The number of inputs N to N:1 multiplexer 120 is equal to the number of shadow registers 60 connected to the multiplexer via second data-out lines 66. Thus, the address bits provided by retrieval controller 114 determine from which of the shadow registers 60 data will be scanned out. Address bits are generated by retrieval controller 114 based on control information received from scan controller 116 via line 254.

The data from a selected shadow register 60 is output from N:1 multiplexer 120 via line 256 to shift register 122. The latter is connected via line 258 to scan controller 116, and provides the shadow register data received from N:1 multiplexer 120 pursuant to control information received from scan controller 116. This data is provided by shift register 122 to an off-chip location via line 260. As those skilled in the art will appreciate, logic elements that perform the same function as N:1 multiplexer 120 may be used in place of the multiplexer.

While it is anticipated that shadow register system 20 will have greatest application in storing and scanning out data present in functional registers 24, it may also be used to provide data to the functional registers. Referring to FIG. 5b, to effectuate this latter function, an alternate embodiment of shadow register controller 112 illustrated in FIG. 5a is provided. The embodiment of FIG. 5b differs in that logic is provided to permit shadow register circuit 90 to operate in either a lock (i.e., store) mode or restore mode. This logic, associated with each n output of RAM 232, includes lock register 264 restore register 266, both connected to scan controller 116. In addition, AND gate 268 and AND gates 270 are provided. AND gate 268 is connected via line 272 to receive as an input lock bits from an n output of RAM 232, and is connected to lock register 264 via line 274 to receive as an input a lock signal from the lock register, when the latter is so programmed by scan controller 116. AND gate 270 is also connected via line 272 to receive as an input lock bits from the n output of RAM 232, and is connected to restore register 266 via line 276 to receive as an input a restore signal from the restore register, when the latter is so programmed by scan controller 116. When inputs are present on both lines 272 and 274 to AND gate 268, the latter provides an enable signal via line 74 to AND gate 70 in shadow register circuit 90. When inputs are present on both lines 272 and 276 to AND gate 270, the latter provides a control signal via line 82 to 2:1 multiplexer 80 in shadow register circuit 90.

While, one set of registers 264 and 266 and one set of AND gates 268 and 270 has been described and is illustrated in FIG. 5b, it is to be appreciated that each n output of RAM 232 is provided to this combination of logic elements.

In connection with the following description of the operation of shadow register system 20, reference should be made to FIGS. 1–5. Shadow register system 20 may be operated in two different ways: to store data provided to selected functional registers and to provide data to selected functional registers. Describing the first type of operation, a user loads into RAM 232 via the scan controller 116, data which will control which shadow registers 60 are locked and in what sequence for each possible event or combination of events.

Scan controller 116 then provides registers 200 with event type information via line 201. For example, if data provided to a functional register 24 is to be stored when a given memory address is provided to the functional register, then such memory address is provided by scan controller 116 to register 200a. When data provided on one of buses 204 matches data in one of registers 200, then a compare circuit 202 connected to such bus and register generates an output signal which is provided via line 205 to event detector unit 206. Upon receipt of such output signal, event detector unit 206 generates an event trigger command on line 208, which is provided to shadow register controller 112.

The compare outputs 210 of compare circuits 202 are also provided via line 210 to registers 236 in counter 230, and then to RAM 232 via lines 238. These compare outputs are the MSB's of the address of the memory block 250 to which execution cycle information is sent from counter 230.

Execution cycle information is also provided by scan controller 116 to counter 230 via line 240. Counter 230 then provides this execution cycle information in the form of count bits provided via lines 234 to RAM 232. For example, if it is desired that data arriving at a selected functional register 24 at the third execution cycle in a given execution period be stored by an associated shadow register 60, then scan controller 116 loads RAM 232 such that on the 3rd execution cycle after the trigger is received on line 208 from event detector unit 206 and a clock signal is provided on line 233 the RAM generates a lock signal.

After receiving event information from compare circuits 202 and execution cycle information from counter 230, RAM 232 provides enable signals (also referred to as lock signals) on lines 74 to those shadow register circuits 90 having lock bits with respect to which a specified event type and execution cycle has occurred. For example, when a first event type arrives at a given functional register 24 and a selected execution cycle arrives, RAM 232 generates a lock signal which is provided on line 74 to the AND gate 70 in the shadow register circuit 90 associated with the given functional register.

Figure 5:
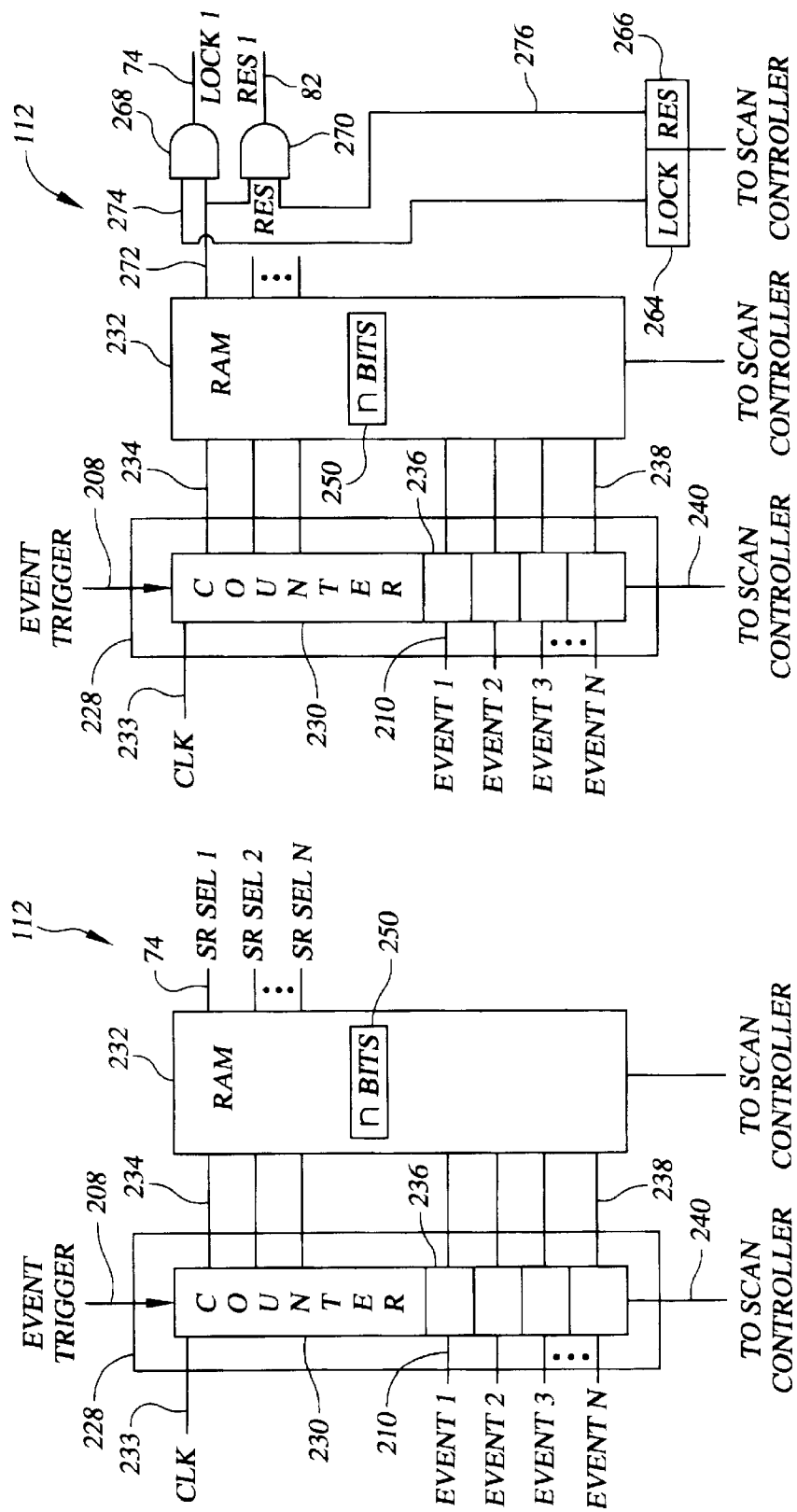
Figure 6:
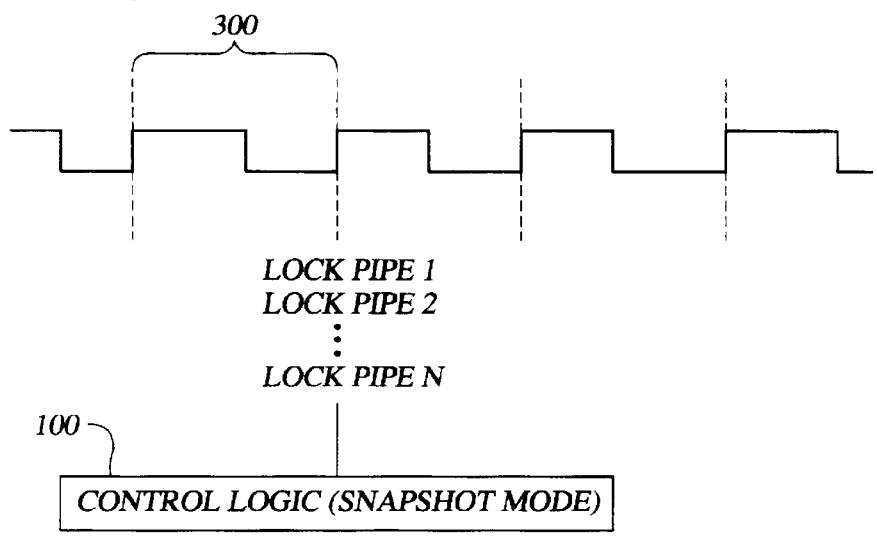
FIG. 6 is a schematic diagram of the control logic of FIG. 3, together with a timing diagram, illustrating operation of the present invention in snapshot mode.

Referring now to FIGS. 1–7, two operational modes illustrating the benefits of the high degree of programmability of shadow register system 20 are illustrated in FIGS. 5 and 6 and described below.

Figure 7:
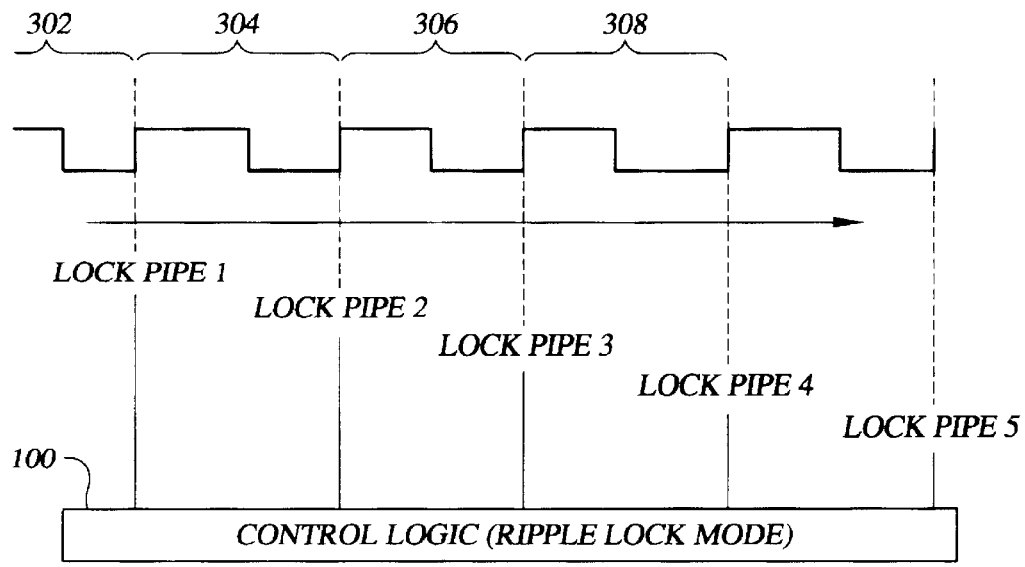
FIG. 7 is similar to FIG. 6, except that it illustrates operation of the present invention in ripple lock mode.

The illustrations in FIGS. 6 and 7 are presented with respect to a logic device comprising a pipelined microprocessor having pipeline stages 50–58, each stage having a plurality of functional registers 24 and an associated plurality of shadow register circuits 90. When shadow register system 20 is operated in the snapshot mode, as illustrated in FIG. 6, data provided to functional registers 24 in all stages 50–58 of logic device 22 is stored at the same time in associated shadow register circuits 90, e.g., at the end of execution cycle 300. This is achieved by scan controller 116 providing event detector 110 and shadow register controller 112 with instructions that for all event types at a specified execution cycle a lock signal is to be generated by RAM 232 for all shadow register circuits 90 associated with functional registers 24 in stages 50–58 of logic device 22. This storing of data occurs, due to the design of shadow register circuit 90, and the control functionality of control logic 100, without interrupting execution cycles in the execution period of logic device 22.

In ripple lock mode, illustrated in FIG. 7, scan controller 116 provides event detector 110 and shadow register controller 112 with instructions that for specified event types at specified execution cycles enable signals are to be generated by RAM 232 for selected shadow register circuits 90. For example, at a first execution cycle 302, upon receipt of a fetch opcode instruction from fetch stage 50, RAM 232 generates an enable signal causing data provided to functional registers 24 in the fetch stage to also be stored by shadow register circuits 90 associated with such functional registers. At a second execution cycle 304, RAM 232 generates an enable signal causing data provided to functional registers 24 in the decode stage to also be stored by shadow register circuits 90 associated with such functional registers. Data is similarly stored by shadow register circuits 90 at the third execution cycle 306 and at the fourth execution cycle 308. This storing of data also occurs without interrupting execution cycles in the execution period of logic device 22.

Once data has been stored in shadow registers 60, a need exits to retrieve the data for purposes of analysis. This is achieved by the user specifying to scan controller 116 which shadow registers 60 contain data to be retrieved. Scan controller 116 then provides commands via line 254 to retrieval controller 114, based on such user instructions, identifying the shadow registers 60 specified by the user. Retrieval controller 114 in turn generates select bits that are provided to N:1 multiplexer 120 via lines 252. These select bits instruct N:1 multiplexer 120 which of the various data outputs on lines 66 from shadow registers 60, which are inputs to the multiplexer, are to be provided as the data output of the multiplexer on line 258. Data output from N:1 multiplexer 120 is provided to shift register 122 which, under the control of scan controller 116, delivers such data on line 260 to an off-chip source. Such data are typically used with known logic development and debug tools to assess the operational state of logic device 24 with which shadow register system 20 is employed.

Rather than using shadow register system 20 to store data provided to associated functional registers 24, in some cases it may be desirable to provide data to such functional registers. As noted above, 2:1 multiplexer 80 and associated control in control logic 100 permits operation of shadow register system 20 in this manner. Scan controller 112 preloads shadow registers 60 with data, e.g., data to patch a logic error, and provides restore signals to restore registers 66 associated with those shadow registers 60 which will be providing data to functional registers 24. When RAM 232 provides an enable command on line 272, AND gate 270 generates a select signal that is delivered as a select input to 2:1 multiplexer 80. This causes 2:1 multiplexer 80 to provide the contents of shadow register 60 to L2 register 40 via line 42. This introduces the contents of shadow register 60 into the logic execution chain or pipeline of logic device 22 for further use.

Because the same logic in control logic 100 is used when shadow register system to operates in this restore mode, the contents of shadow registers 60 may be provided to L2 register as a function of event type, execution cycle and shadow register address, just as these factors are used in controlling when the shadow registers store data, as described above. Event detector 110 and shadow register controller 112 are responsible for controlling the delivery of event type, execution cycle and shadow register selection information, as described above with respect to the generation of the enable command provided to AND gate 70. Using this information, the contents of shadow registers 60 are provided via the multiplexer as an input to L2 register 40.

Since certain changes may be made in the above system and method without departing from the scope of the present invention, it is intended that all matter contained in the above description or shown in the accompanying drawing shall be interpreted in an illustrative and not in a limiting sense.

What is claimed is:

1. A logic device having a functional execution period with a plurality of execution cycles, the device comprising:

a. a plurality of functional registers, each for storing data during an execution cycle, wherein ones of said plurality of functional registers include a first register in which data is captured and a second register connected to said first register for receiving said data from said first register and launching said data to other elements of the logic device;

b. a plurality of shadow registers, each associated wit one of said plurality of functional registers and capable of storing a copy of data provided to said associated one of said plurality of functional registers during the functional execution period without interrupting the execution cycles; and c. control logic connected to said plurality of shadow registers for causing data to be provided to or retrieved from selected ones of said plurality of shadow registers.

2. A logic device according to claim 1, further wherein one of said plurality of shadow registers is connected to each of said second registers so that data stored in said one shadow register may be provided to said second register.

3. A logic device according to claim 2, further including a plurality of logic elements, each having a first input and a second input and one output, wherein said first input is connected to receive data from one of said plurality of first registers and said second input is connected to receive data from one of said pluraliry of shadow registers, and said one output is connected to provide data received from said one of said plurality of first registers or said one of said plurality of shadow registers to said second register.

4. A logic device having a functional execution period with a plurality of execution cycles, the device comprising:

a. plurality of functional registers, each for storing data during an execution cycle;

b. a plurality of shadow registers, each associated with one of said plurality of functional registers and capable of storing a copy of data provided to said associated one of said plurality of functional registers during the functional execution period without interrupting the execution cycles; and c. control logic connected to said plurality of shadow registers for causing data to be provided to or provided from selected one of said plurality of shadow registers, wherein said control logic includes:

i. an event detector for detecting the occurrence of an event and generating a trigger command when said event is detected;

ii. a shadow register controller connected to said event detector for generating a lock command upon receipt of said trigger command that causes ones of said plurality of shadow registers to store said copy of data; and iii. a scan controller connected to said event detector and said shadow register controller for providing information to said event detector regarding events to be detected and for providing information to said shadow register controller regarding the execution cycle on which said copy of data is to be stored and the ones of said plurality of shadow registers with respect to which said copy of data is to be stored.

5. A logic device having a functional execution period with a plurality of execution cycles, the device comprising:

a. a plurality of functional registers, each for storing data during an execution cycle;

b. a plurality of shadow registers, each associated with one of said plurality of functional registers and capable of storing a copy of data provided to said associated one of said plurality of functional registers during the functional execution period without interrupting the execution cycles; and c. control logic connected to said plurality of shadow registers for causing data to be provided to or provided from selected one of said plurality of shadow registers, wherein said control logic includes a plurality of multiplexers, each having first and second inputs and an output, wherein said first input is connected to one of said plurality of shadow registers and said second input is connected to said one of said plurality of functional registers associated with said one shadow register.

6. A logic register combination for use in a logic device having a functional execution period with a plurality of execution cycles, the combination comprising:

a. a plurality of functional registers for performing logic operations, each for storing data during an execution cycle;

b. a plurality of shadow registers, each associated with one of said plurality of functional registers and capable of storing a copy of data provided to said associated one of said plurality of functional registers during said execution cycle without interrupting the execution cycles, each of said plurality of shadow registers being individually accessible for read and write operations independent of remaining ones of said plurality of shadow registers; and c. wherein ones of said plurality of functional registers include a first register in which data is captured and a second register connected to said first register for receiving said data from said first register and launching said data to other elements of the logic device, further wherein one of said plurality of shadow registers is connected to each of said second registers so that data stored in said one shadow register may be provided to said second register.

* * * * *